US012712253B2

(12) United States Patent
Moon et al.

(10) Patent No.: US 12,712,253 B2
(45) Date of Patent: Aug. 18, 2026

(54) ELECTRONIC APPARATUS

(71) Applicant: Samsung Display Co., Ltd., Yongin-si (KR)

(72) Inventors: Dongil Moon, Yongin-si (KR); Hyeonseok Bae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 18/667,257

(22) Filed: May 17, 2024

(65) Prior Publication Data

US 2025/0132485 A1 Apr. 24, 2025

(30) Foreign Application Priority Data

Oct. 23, 2023 (KR) ........................ 10-2023-0142348

(51) Int. Cl.
*H01Q 1/22* (2006.01)
*H01Q 7/00* (2006.01)
*H05K 1/14* (2006.01)
*H05K 1/18* (2006.01)

(52) U.S. Cl.
CPC ................. *H01Q 1/22* (2013.01); *H01Q 7/00* (2013.01); *H05K 1/147* (2013.01); *H05K 1/18* (2013.01); *H05K 2201/10098* (2013.01); *H05K 2201/10128* (2013.01); *H05K 2201/10189* (2013.01)

(58) Field of Classification Search
CPC ...... G04G 17/02; G04G 17/04; G04G 17/045; G04R 60/06; G04R 60/10; H01Q 1/22; H01Q 1/243; H01Q 1/273; H01Q 7/00; H04B 5/26; H04B 5/43
See application file for complete search history.

(56) References Cited

U.S. PATENT DOCUMENTS

| | | | | |
|---|---|---|---|---|
| 9,674,646 | B2 | 6/2017 | Jang et al. | |
| 10,001,891 | B2 | 6/2018 | Ikeda et al. | |
| 10,236,581 | B2 | 3/2019 | Moon et al. | |
| 10,250,064 | B2 | 4/2019 | Park et al. | |
| 11,329,367 | B2 * | 5/2022 | Huang | H01Q 1/526 |
| 11,573,599 | B2 * | 2/2023 | Chiang | H04R 1/08 |

(Continued)

FOREIGN PATENT DOCUMENTS

| | | |
|---|---|---|
| CN | 205646168 | 10/2016 |
| JP | 2017-175338 | 9/2017 |

(Continued)

OTHER PUBLICATIONS

Partial European Search Report dated Feb. 18, 2025, in European Patent Application No. 24197233.0.

*Primary Examiner* — Thien M Le
(74) *Attorney, Agent, or Firm* — Lerner David LLP

(57) ABSTRACT

An electronic apparatus having a simple structure and capable of near-field communication comprises a light-transmitting window, a display panel disposed over the light-transmitting window, a printed circuit board electrically connected to the display panel, disposed over a side of the display panel to face away from the light-transmitting window, and including wires and a near-field communication antenna, and a main circuit board electrically connected to the printed circuit board and disposed over a side of the printed circuit board to face away from the display panel.

20 Claims, 13 Drawing Sheets

(56) References Cited

U.S. PATENT DOCUMENTS

| | | | | |
|---|---|---|---|---|
| 11,695,196 | B2 * | 7/2023 | Scordilis | G04G 21/04 455/41.2 |
| 2008/0278384 | A1 * | 11/2008 | Shimasaki | H01Q 1/2266 343/702 |
| 2010/0238076 | A1 * | 9/2010 | Lin | H01Q 1/38 343/702 |
| 2010/0289706 | A1 * | 11/2010 | Hsieh | H01Q 1/2266 343/702 |
| 2013/0234899 | A1 * | 9/2013 | Pope | H01Q 1/526 343/702 |
| 2015/0155628 | A1 * | 6/2015 | Cho | H04B 5/48 343/867 |
| 2016/0190854 | A1 * | 6/2016 | Woo | H02J 7/00712 320/108 |
| 2016/0276741 | A1 * | 9/2016 | Yagi | H01Q 9/0485 |
| 2017/0194710 | A1 | 7/2017 | Wolff et al. | |
| 2019/0019621 | A1 | 1/2019 | Cho | |
| 2020/0365626 | A1 | 11/2020 | Lin et al. | |
| 2020/0411989 | A1 | 12/2020 | Oh | |
| 2021/0075094 | A1 * | 3/2021 | Da Costa Bras Lima | H04B 5/26 |
| 2021/0313670 | A1 * | 10/2021 | Taga | H01Q 1/273 |

FOREIGN PATENT DOCUMENTS

| | | |
|---|---|---|
| KR | 10-1400623 | 5/2014 |
| KR | 10-1782793 | 9/2017 |
| KR | 10-2311534 | 10/2021 |
| KR | 10-2527360 | 5/2023 |

* cited by examiner

ELECTRONIC APPARATUS

CROSS-REFERENCE TO RELATED APPLICATION

This application and claims priority to and benefits of Korean Patent Application No. 10-2023-0142348 under 35 U.S.C. § 119, filed on Oct. 23, 2023, in the Korean Intellectual Property Office (KIPO), the disclosure of which is incorporated by reference herein in its entirety.

BACKGROUND

1. Technical Field

One or more embodiments relate to an electronic apparatus, and more particularly, to an electronic apparatus having a simple structure and capable of near-field communication.

2. Description of the Related Art

In general, an electronic apparatus such as a smartwatch or a smartphone includes a display panel. The electronic apparatus also includes a wireless communication antenna to communicate wirelessly with external devices. Particularly, in recent years, an increasing number of electronic apparatuses include an antenna for near-field communication. In addition, the electronic apparatus includes a flexible printed circuit board for generating or transmitting electrical signals to be applied to the display panel. These various configurations of the electronic apparatus are placed in a case that forms the overall appearance of the electronic apparatus.

SUMMARY

However, an electronic apparatus of the related art is complex to manufacture due to the presence of various elements.

To solve various problems including the above problem, one or more embodiments include an electronic apparatus having a simplified or streamlined structure and capable of near-field communication. However, such a technical problem is an example, and one or more embodiments are not limited thereto.

Additional aspects will be set forth in part in the description which follows and, in part, will be apparent from the description, or may be learned by practice of the presented embodiments of the disclosure.

According to one or more embodiments, an electronic apparatus includes a light-transmitting window, a display panel disposed over the light-transmitting window, a printed circuit board electrically connected to the display panel, disposed over a side of the display panel to face away from the light-transmitting window, and including wires and a near-field communication antenna, and a main circuit board electrically connected to the printed circuit board and disposed over a side of the printed circuit board to face away from the display panel.

The printed circuit board may include an antenna area and a peripheral area outside the antenna area, and the near-field communication antenna may be disposed in the antenna area.

In the printed circuit board, the wires may not be disposed in the antenna area except for one or more of the wires electrically connected to the near-field communication antenna.

Among the wires in the printed circuit board, wires other than one or more of the wires electrically connected to the near-field communication antenna may be in the peripheral area.

The electronic apparatus may further include a cover panel between the display panel and the printed circuit board.

The cover panel may include a cushion layer and a metal layer, and the metal layer may include a transmissive opening.

When viewed in a direction perpendicular to the display panel, the transmissive opening may overlap the antenna area.

When viewed in the direction perpendicular to the display panel, an area of the transmissive opening may be substantially equal to or greater than an area of the antenna area.

The printed circuit board may include a first connector electrically connected to at least one of the wires and the near-field communication antenna, and the main circuit board may include a first main connector electrically connected to the first connector.

The printed circuit board may include a first connector electrically connected to at least one of the wires and a second connector electrically connected to the near-field communication antenna, and the main circuit board may include a first main connector electrically connected to the first connector and a second main connector electrically connected to the second connector.

The electronic apparatus may further include a first terminal electrically connected to an end of the near-field communication antenna, the first terminal and the near-field communication antenna being disposed on a same layer, and a second terminal electrically connected to another end of the near-field communication antenna, the second terminal and the near-field communication antenna being disposed on different layers.

The first terminal and the near-field communication antenna may be integral with each other.

The electronic apparatus may further include a first terminal disposed on a layer electrically connected to an end of the near-field communication antenna, the first terminal and the near-field communication antenna being disposed on a same layer, an additional antenna having an end electrically connected to another end of the near-field communication antenna, the additional antenna and the near-field communication antenna being disposed on different layers, and a second terminal electrically connected to another end of the additional antenna.

The first terminal and the near-field communication antenna may be integral with each other.

The second terminal and the first terminal may be disposed on a same layer.

According to one or more embodiments, an electronic apparatus includes a light-transmitting window, a display panel disposed over the light-transmitting window, a printed circuit board electrically connected to the display panel, disposed over a side of the display panel to face away from the light-transmitting window, and including wires that transmit an electrical signal to be applied to the display panel, and a main circuit board electrically connected to the printed circuit board, disposed over a side of the printed circuit board to face away from the display panel, and including wires and a near-field communication antenna.

The main circuit board may include an antenna area and a peripheral area outside the antenna area, and the near-field communication antenna may be disposed in the antenna area.

In the main circuit board, the wires may not be disposed in the antenna area except for one or more of the wires electrically connected to the near-field communication antenna.

Among the wires in the main circuit board, wires other than one or more of the wires electrically connected to the near-field communication antenna may be in the peripheral area.

The electronic apparatus may further include a cover panel between the display panel and the printed circuit board and including a cushion layer and a metal layer, wherein the metal layer may include a transmissive opening.

When viewed in a direction perpendicular to the display panel, the transmissive opening may overlap the antenna area, and the wires in the printed circuit board may overlap the peripheral area.

When viewed in the direction perpendicular to the display panel, an area of the transmissive opening may be substantially equal to or greater than an area of the antenna area.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
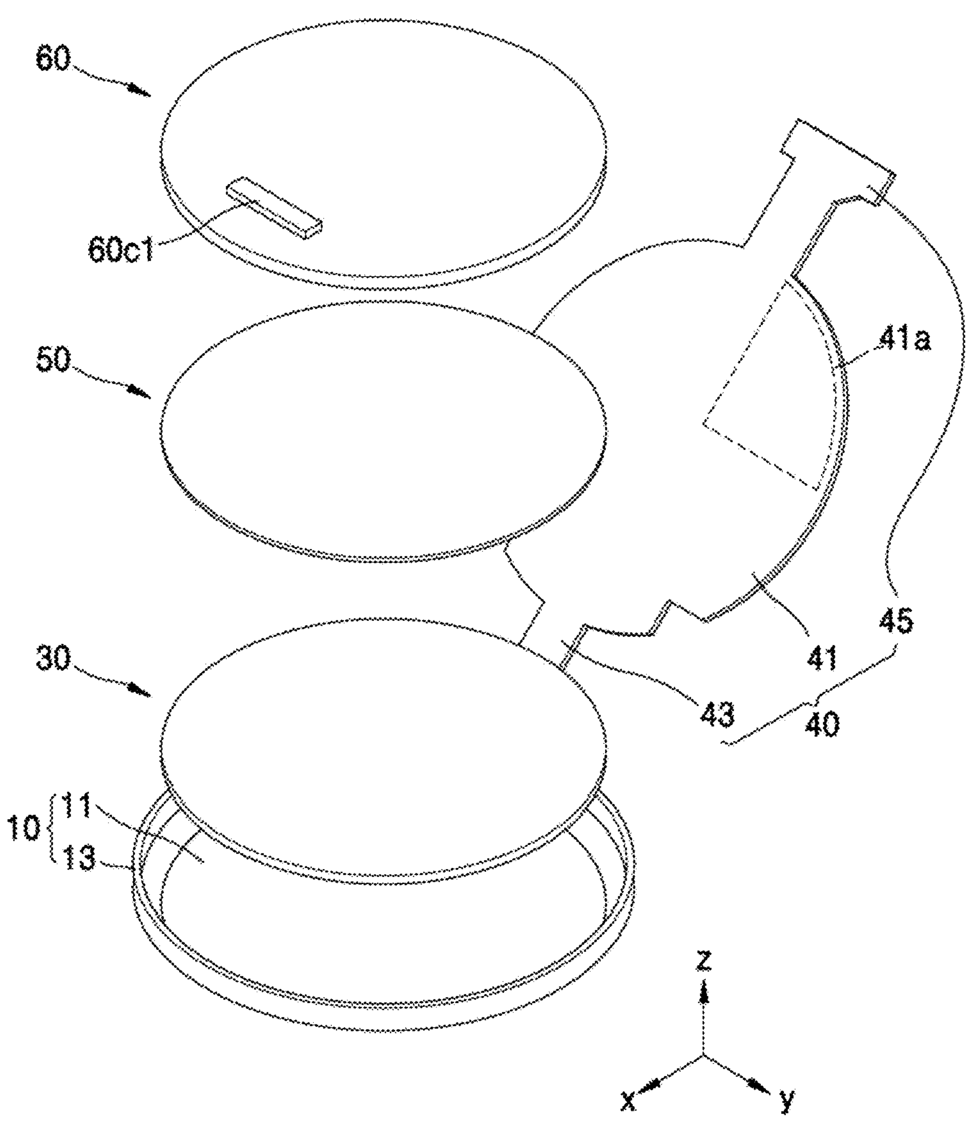
FIG. 1 is a schematic exploded perspective view of a portion of an electronic apparatus according to an embodiment.

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain aspects of the description.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

As the description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

One or more embodiments will be described below in more detail with reference to the accompanying drawings. Those elements that are the same or are in correspondence with each other are rendered the same reference numeral or character regardless of the figure number, and redundant descriptions thereof may be omitted.

It will be understood that, when an element, such as a layer, a film, a region, or a plate, is referred to as being "on" another element, it may be "directly on" the other element, or intervening elements may be present therebetween. In addition, sizes of elements in the drawings may be exaggerated or reduced for convenience of explanation. For example, since sizes and thicknesses of elements in the drawings may be arbitrarily illustrated for convenience of explanation, the following embodiments are not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

While such terms as "first" and "second" may be used to describe various elements, such elements must not be limited to the above terms. The above terms are used only to distinguish one element from another.

It will be further understood that the terms "include," "comprise," and "have" as used herein specify the presence of stated features or elements but do not preclude the addition of one or more other features or elements.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
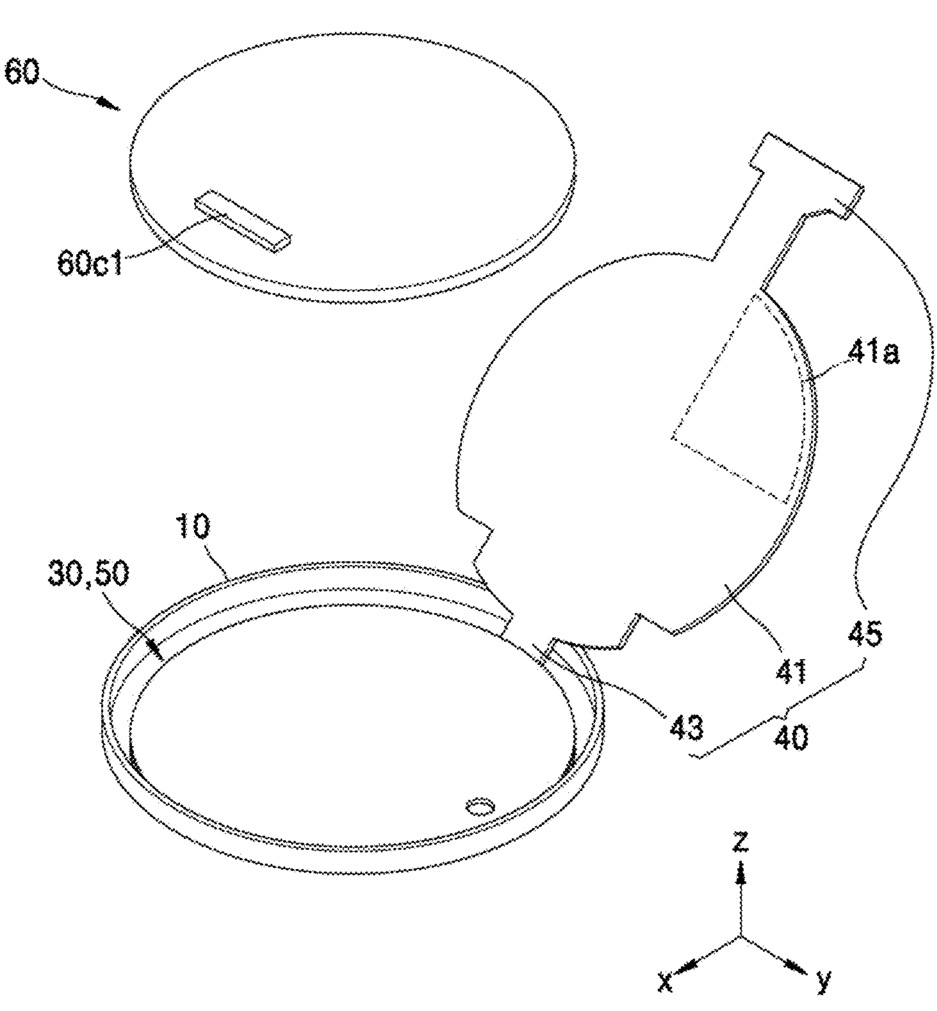
FIG. 2 is a perspective view schematically showing some elements shown in FIG. 1 which are stacked on each other.
Figure 3:
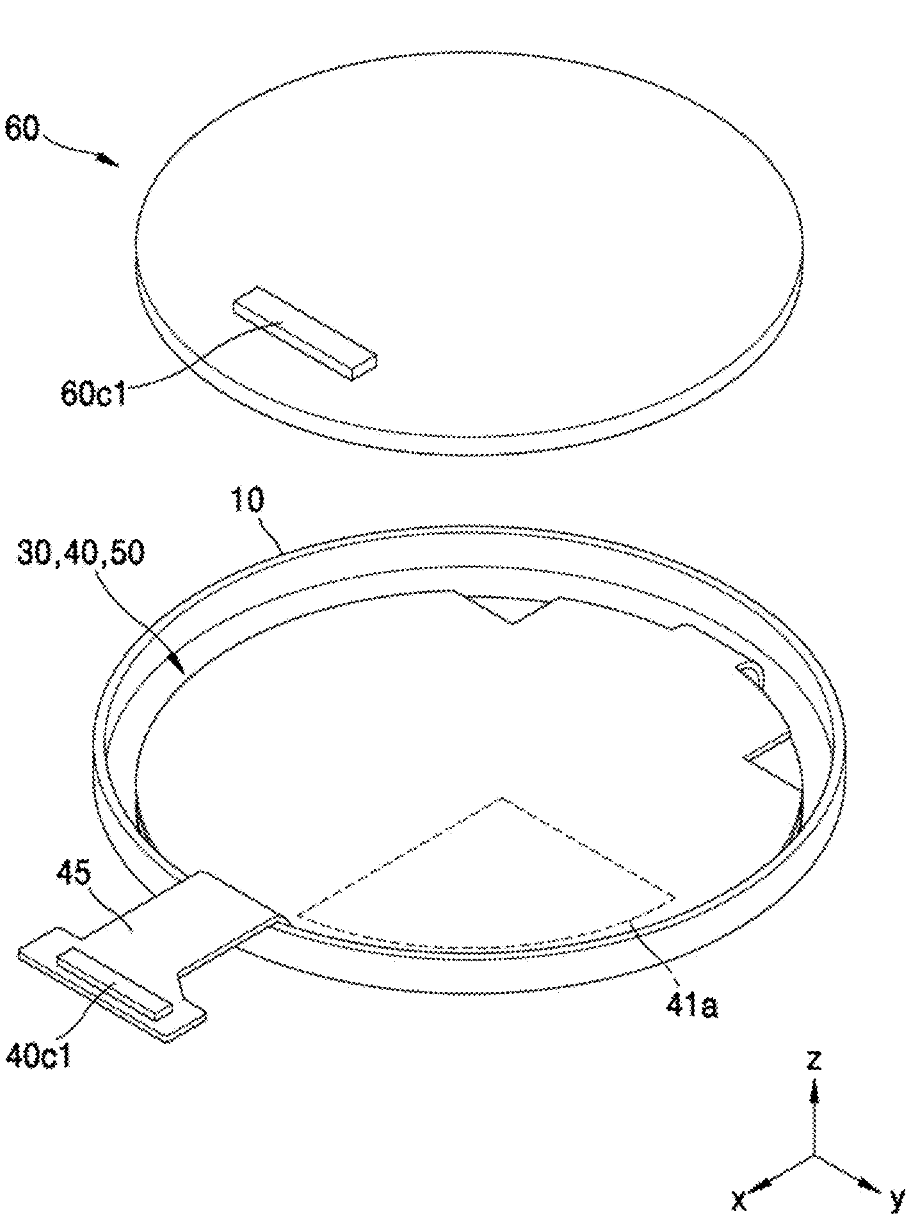
FIG. 3 is a perspective view schematically showing some elements shown in FIG. 2 which are bent.

FIG. 1 is a schematic exploded perspective view of a portion of an electronic apparatus according to an embodiment. FIG. 2 is a perspective view schematically showing some elements shown in FIG. 1 which are stacked on each other. FIG. 3 is a perspective view schematically showing some elements shown in FIG. 2 which are bent.

The electronic apparatus according to the embodiment may include a window 10, a display panel 30, a printed circuit board 40, and/or a main circuit board 60. In some cases, the electronic apparatus may further include various elements as shown in FIG. 1. For example, the electronic apparatus may further include a cover panel 50 disposed between the display panel 30 and the printed circuit board 40. The electronic apparatus may further include a back cover (not shown) coupled to the window 10 to allow various elements to be positioned inside.

Examples of the electronic apparatus may include various electronics such as a smartwatch, a smartphone, and/or a tablet.

The window 10 may be formed of a light-transmitting material and may include glass or polymer resin. The window 10 may include, for example, polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The window 10 may include a base 11 and an edge portion 13. The base 11 may determine the overall appearance of the window 10 and transmit light. The edge portion 13 may protrude from a first virtual plane on (or in) which the base 11 is located. FIG. 1 shows that the base 11 may be located on the first virtual plane that is approximately parallel to an x-y plane and the edge portion 13 may protrude from an edge of the base 11 approximately in a direction (e.g., +z direction) perpendicular to the x-y plane. The base 11 and the edge portion 13 may include a same material and may be integrally formed as a single body (or integral with each other), but one or more embodiments are not limited thereto. For example, the edge portion 13 may be a separate element from the base 11 and may be coupled to the edge of the base 11. In this case, the edge portion 13 may be non-transmissive, unlike the light-transmitting base 11.

The base 11 may be located in the first virtual plane, and the first plane may be curved. For example, in case that the electronic apparatus is a smartwatch, the base 11 included in the window 10 may have a flat shape as a whole, but an outer surface of the base 11 opposite to the display panel 30 (i.e., the outer surface in-z direction) may include a portion that is microscopically curved.

The display panel 30 may be disposed on the base 11 of the window 10. The display panel 30 may include a circuit that includes an electronic device such as a thin-film transistor on a substrate, and a display element such as an organic or inorganic light-emitting diode electrically connected to the circuit. However, one or more embodiments are not limited thereto, and the display panel 30 may include various display elements such as a liquid crystal device instead of the organic light-emitting diode.

The printed circuit board 40 may be flexible. The printed circuit board 40 may be electrically connected to the display panel 30. For example, as shown in FIG. 1, a portion of the printed circuit board 40 may be attached onto and/or electrically connected onto a surface of the display panel 30 in a direction toward the window 10. In this case, wires or pads of the printed circuit board 40 may be electrically connected to pads positioned on the surface of the display panel 30 in a direction toward the window 10 through an anisotropic conductive film, etc.

The printed circuit board 40 may include a body portion 41, a neck portion 43 protruding from the body portion 41, and/or a first connecting portion 45 protruding from the body portion 41. The neck portion 43 may be in contact with the display panel 30 as described above. The body portion 41 may have an area greater than that of the neck portion 43, and an electronic device such as an integrated circuit may be attached to the body portion 41 of the printed circuit board 40 through an anisotropic conductive film, etc. Pads electrically connected to an electronic device may be positioned in the body portion 41, and wires extending to the neck portion 43 and/or the first connecting portion 45 may also be positioned in the body portion 41. Electrical signals to be applied to the display panel 30 may be transmitted through the wires. Further, as will be described below, a near-field communication antenna ATN (refer to FIG. 5) may be positioned at the body portion 41. A first connector 40$c$1 may be positioned at the first connecting portion 45, and wires extending from the body portion 41 may be electrically connected to the first connector 40$c$1.

The cover panel 50 may be disposed between the display panel 30 and the printed circuit board 40. A detailed description of the cover panel 50 is given below.

The display panel 30 and the cover panel 50 may be on the window 10 as shown in FIG. 2. For example, the display panel 30 and the cover panel 50 may be positioned inside a space defined by the base 11 and the edge portion 13 of the window 10. The printed circuit board 40 electrically connected to the display panel 30 may be bent at the neck portion 43 as shown in FIG. 3, and thus, the body portion 41 may be placed on the cover panel 50. The printed circuit board 40 may be flexible as described above, the neck portion 43 may be flexible and may be bent as shown in FIGS. 2 and 3, and the body portion 41 may be placed on the cover panel 50. In some cases, the body portion 41 may also be flexible. In this case, the neck portion 43 may be more flexible than the body portion 41.

The printed circuit board 40 having the neck portion 43 electrically connected to the display panel 30 as described above may be bent at the neck portion 43, and the body portion 41 may be disposed over a side of the display panel 30 to face away from the window 10 (e.g., may be disposed in the +z direction from the display panel 30). It may be understood as describing that the printed circuit board 40 is opposite to the window 10 (in the +z direction) with respect to the display panel 30.

As shown in FIG. 3, the main circuit board 60 may be on the printed circuit board 40 having the neck portion 43 bent. The main circuit board 60 may be electrically connected to the printed circuit board 40 and may be disposed over a side of the printed circuit board 40 to face away from the display panel 30 (e.g., may be disposed in the +z direction from the printed circuit board 40). Electronic elements such as an application processor (AP) or a central processing unit (CPU) of an electronic apparatus may be on the main circuit board 60, and wires configured to transmit an electrical signal from those electronic elements or an electrical signal to those electronic elements may also be on the main circuit board 60. The main circuit board 60 may not be flexible unlike the printed circuit board 40. The main circuit board 60 may include a first main connector 60*c*1, and the first connector 40*c*1 of the printed circuit board 40 may be fastened to the first main connector 60*c*1 of the main circuit board 60 to electrically connect the printed circuit board 40 to the main circuit board 60.

Figure 4:
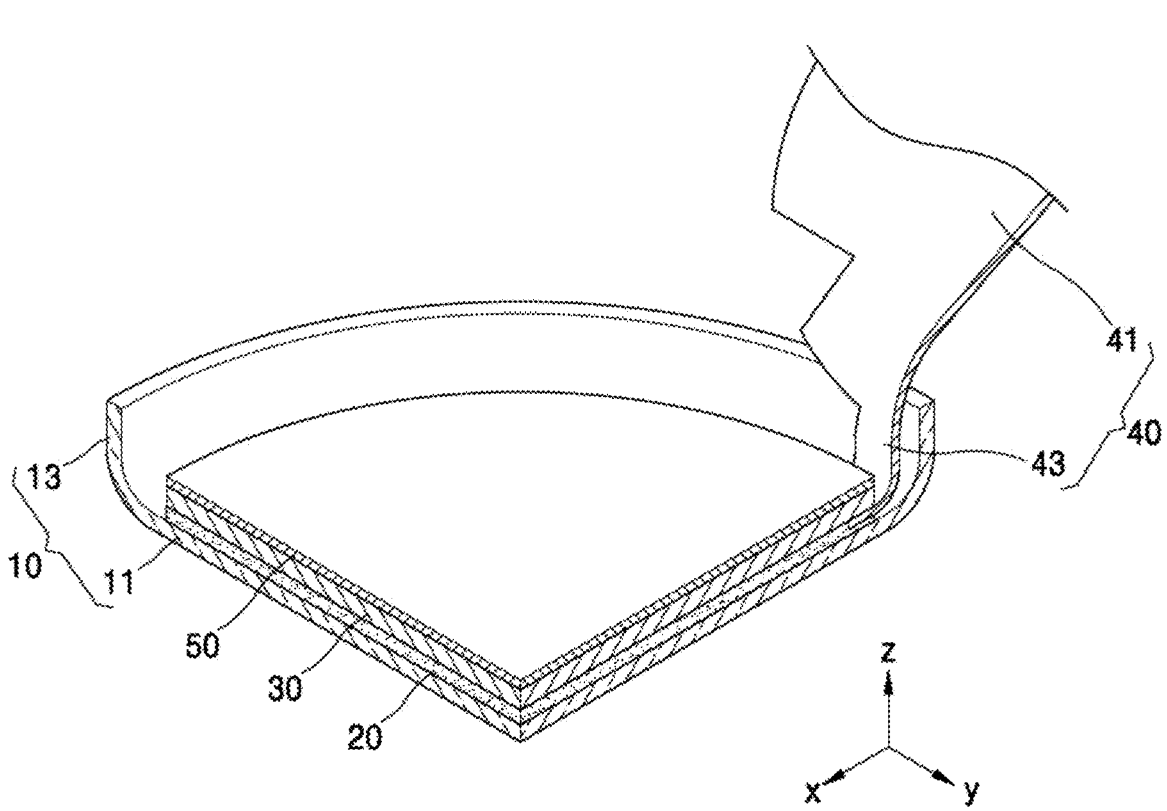
FIG. 4 is a perspective view schematically showing a shape of a portion of the electronic apparatus of FIG. 1 during a process of manufacturing the electronic apparatus of FIG. 1.

FIG. 4 is a perspective view schematically showing a shape of a portion of the electronic apparatus of FIG. 1 during a process of manufacturing the electronic apparatus of FIG. 1. As shown in FIG. 4, during a process of manufacturing the electronic apparatus, the display panel 30 and the cover panel 50 are placed in a space defined by the base 11 and the edge portion 13 of the window 10, and then, the printed circuit board 40 is bent at the neck portion 43 to place the body portion 41 of the printed circuit board 40 on the display panel 30 and the cover panel 50. FIG. 4 may be understood as showing a process of placing the display panel 30 and the cover panel 50 in a space defined by the base 11 and the edge portion 13 of the window 10 during a process of manufacturing the electronic apparatus. A light-transmitting adhesive layer 20 may be disposed between the window 10 and the display panel 30 to bond the window 10 and the display panel 30.

Figure 5:
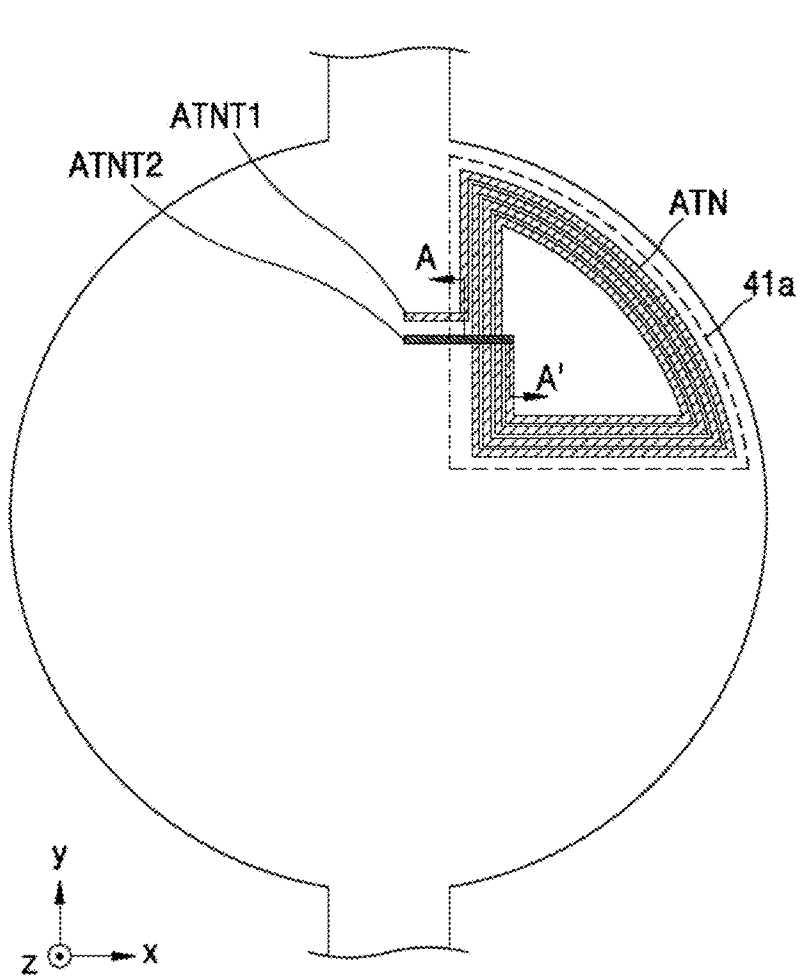
FIG. 5 is a schematic plan view of a printed circuit board of the electronic apparatus of FIG. 1.
Figure 6:
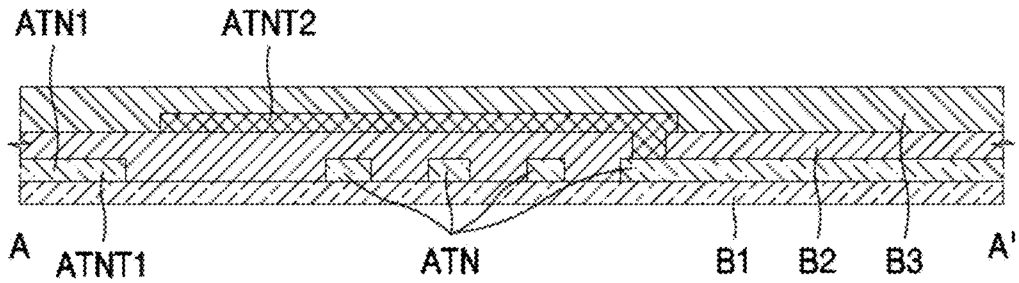
FIG. 6 is a schematic cross-sectional view of the printed circuit board of FIG. 5, taken along line A-A' of FIG. 5.

FIG. 5 is a schematic plan view of the printed circuit board 40 of the electronic apparatus of FIG. 1. FIG. 6 is a schematic cross-sectional view of the printed circuit board 40 of FIG. 5, taken along a line A-A' of FIG. 5. As described above, the printed circuit board 40 includes the near-field communication antenna ATN. The printed circuit board 40 may have an antenna area 41*a* and a peripheral area outside the antenna area 41*a*. The near-field communication antenna ATN may be in the antenna area 41*a*. As shown in FIG. 5, the antenna area 41*a* may be positioned at the body portion 41 of the printed circuit board 40.

An induced current corresponding to an hourly change in magnetic flux density passing through the near-field communication antenna ATN may be induced in the near-field communication antenna ATN. To react to such a change in magnetic flux density sensitively, as shown in FIG. 5, the near-field communication antenna ATN may be arranged in a form of a coil in a plane (e.g., the x-y plane) where the printed circuit board 40 is disposed. In FIG. 5, the near-field communication antenna ATN is illustrated as having a shape like a wire extending from the outside to the inside while rotating clockwise. However, embodiments are not limited thereto, and the near-field communication antenna ATN may have different shapes within the spirit and scope of the disclosure.

A first terminal ATNT1 may be electrically connected to an end of the near-field communication antenna ATN, and a second terminal ATNT2 may be electrically connected to another end of the near-field communication antenna ATN. Each of the first terminal ATNT1 and the second terminal ATNT2 may be, for example, a portion of a wire. FIGS. 5 and 6 show that the first terminal ATNT1 may be disposed on a layer on which the near-field communication antenna ATN may be disposed such that the first terminal ATNT1 and the near-field communication antenna ATN are integrally formed as a single body, and the second terminal ATNT2 may be disposed on a layer different from the layer on which the near-field communication antenna ATN may be disposed. For example, the printed circuit board 40 may have a structure in which a first base B1, a second base B2, and a third base B3, which are insulating layers including a resin (e.g., polyimide or a similar resin), are sequentially stacked on one another, and the near-field communication antenna ATN and the first terminal ATNT1 may be disposed between the first base B1 and the second base B2, and the second terminal ATNT2 may be disposed between the second base B2 and the third base B3 and may be in contact with the another end of the near-field communication antenna ATN through a contact hole defined in the second base B2.

In the above case of the electronic apparatus according to the embodiment, the printed circuit board 40 may include the near-field communication antenna ATN, and accordingly, an electronic apparatus capable of near-field communication and having a simple structure compared to a case where the near-field communication antenna ATN is provided as a separate element distinct from the printed circuit board 40 may be implemented.

As described above, wires may be arranged at the printed circuit board 40 to transmit an electrical signal to be applied to the display panel 30 etc. through those wires. The wires may be omitted in FIG. 5 for convenience of illustration. As described above, the near-field communication antenna ATN may be in the antenna area 41*a*. On the other hand, except wires connected to the near-field communication antenna ATN, for example, except the first terminal ATNT1 and the second terminal ATNT2, other wires may not be in the antenna area 41*a* but in the peripheral area. For example, in the printed circuit board 40, there may be no wires in the antenna area 41*a*, other than a wire or wires connected to the near-field communication antenna ATN.

As described above, because an induced current corresponding to an hourly change in magnetic flux density passing through the near-field communication antenna ATN may be induced in the near-field communication antenna ATN, the near-field communication antenna ATN may sense an ambient signal. If a wire including metal is in the antenna area 41*a*, sensitivity of the near-field communication antenna ATN may be degraded. Accordingly, except wires connected to the near-field communication antenna ATN, for example, except the first terminal ATNT1 and the second terminal ATNT2, other wires may not be in the antenna area 41*a* but in the peripheral area. For reference, as shown in FIG. 6, the printed circuit board 40 may have a multi-layer structure, and the first terminal ATNT1 may be disposed on a layer different from a layer on which the second terminal ATNT2 is disposed. Similarly, some of wires included in the printed circuit board 40 may be between the first base B1 and the second base B2, and some may be between the second base B2 and the third base B3. In any case, those wires may not be in the antenna area 41*a*.

Figure 7:
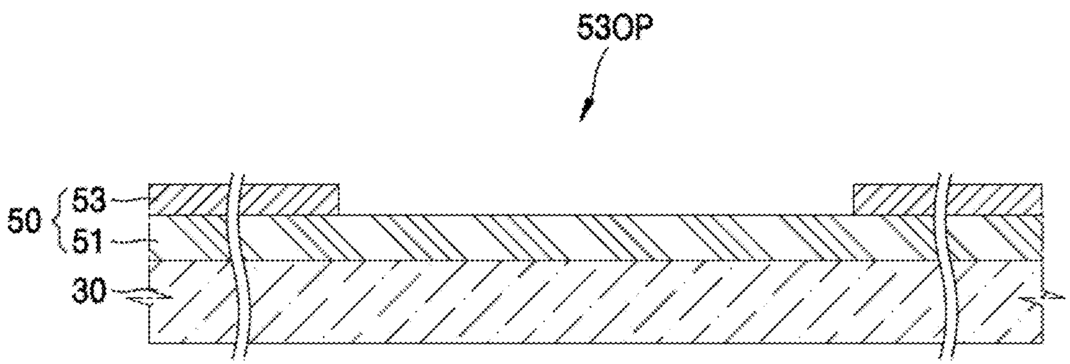
FIG. 7 is a schematic cross-sectional view of a cover panel included in the electronic apparatus of FIG. 1.

As described above, the cover panel 50 may be disposed between the display panel 30 and the printed circuit board 40. FIG. 7 is a schematic cross-sectional view of the display panel 30 and the cover panel 50. As shown in FIG. 7, the cover panel 50 may include a cushion layer 51 and a metal layer 53. In some cases, the cushion layer 51 may be attached to the display panel 30 through an adhesive. The metal layer 53 may include, for example, copper. The cover panel 50 may be disposed over a side of the display panel 30 to face away from the window 10 (i.e., may be disposed in the +z direction from the display panel 30) to shield the display panel 30 from external electrical signals or electromagnetic waves.

As shown in FIG. 7, the metal layer 53 of the cover panel 50 may have a transmissive opening 53OP. As described above, in case that a wire including metal is in the antenna area 41*a*, sensitivity of the near-field communication antenna ATN may be degraded. Even in case that the metal layer 53 of the cover panel 50 overlaps the antenna area 41*a*, sensitivity of the near-field communication antenna ATN may be degraded. Accordingly, the metal layer 53 of the cover panel 50 may have the transmissive opening 53OP, and thus, the degradation of sensitivity of the near-field communication antenna ATN may be effectively prevented. Particularly, when viewed in a direction (the z-axis direction) perpendicular to the display panel 30 (i.e., in a plan view), the transmissive opening 53OP in the metal layer 53 may overlap the antenna area 41*a* of the printed circuit board 40, and thus, high sensitivity of the near-field communication antenna ATN may be maintained. In this regard, when viewed in the direction (the z-axis direction) perpendicular to the display panel 30, an area of the transmissive opening 53OP of the metal layer 53 may be substantially equal to or greater than that of the antenna area 41*a* of the printed circuit board 40, and thus, high sensitivity of the near-field communication antenna ATN may be reliably maintained.

For reference, in case that the electronic apparatus according to the embodiment is a smartwatch or smartphone, a user may place the display panel 30 and the window 10 adjacent to a near-field communication device. Accordingly, electromagnetic waves from the near-field communication device may pass through the window 10, the display panel 30, and the cover panel 50 and reach the near-field communication antenna ATN of the printed circuit board 40. In the electronic apparatus according to the embodiment, the metal layer 53 included in the cover panel 50 may have the transmissive opening 53OP, and accordingly, even in case that a user uses the electronic apparatus in such a way, near-field communication may be performed smoothly.

An electrical signal received or generated by the near-field communication antenna ATN may be transmitted to the main circuit board 60. As described above, because the first connector 40*c*1 may be disposed on the printed circuit board 40, the first connector 40*c*1 may be electrically connected to at least one of the wires of the printed circuit board 40 and the near-field communication antenna ATN. Accordingly, the electrical signal received or generated by the near-field communication antenna ATN may be transmitted to the main circuit board 60 through the first connector 40*c*1 of the printed circuit board 40 and the first main connector 60*c*1 of the main circuit board 60.

Figure 8:
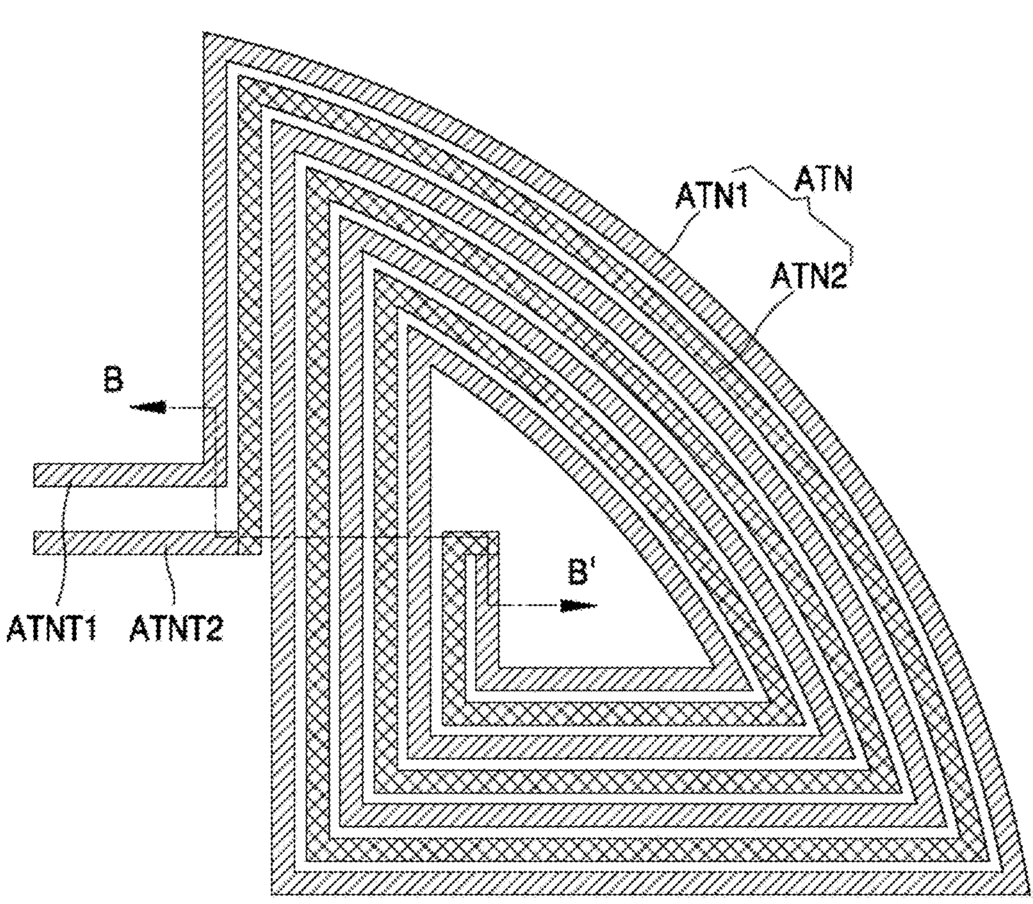
FIG. 8 is a schematic plan view of a portion of the printed circuit board of the electronic apparatus of FIG. 1.
Figure 9:
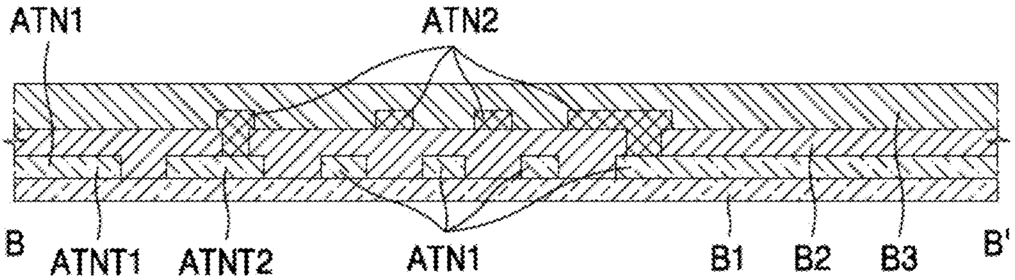
FIG. 9 is a schematic cross-sectional view of the portion of the printed circuit board of FIG. 8, taken along line B-B' of FIG. 8.

FIG. 8 is a schematic plan view of a portion of the printed circuit board 40 of the electronic apparatus of FIG. 1. FIG. 9 is a schematic cross-sectional view of the portion of the printed circuit board 40 of FIG. 8, taken along a line B-B' of FIG. 8. As shown in FIG. 8, the near-field communication antenna ATN included in the electronic apparatus according to the embodiment may include a first antenna ATN1 and a second antenna ATN2. Because the first antenna ATN1 may correspond to the near-field communication antenna ATN described above with reference to FIG. 5, the second antenna ATN2 may be referred to as an additional antenna from this perspective. Hereinafter, it is assumed for convenience of description that the near-field communication antenna ATN includes the first antenna ATN1 and the second antenna ATN2.

As shown in FIG. 8, the near-field communication antenna ATN may be arranged in the form of a coil in a plane (e.g., the x-y plane) where the printed circuit board 40 is disposed. In FIG. 8, the first antenna ATN1 is illustrated as having a shape like a wire extending from the outside to the inside while rotating clockwise. The second antenna ATN2 is illustrated as having a shape like a wire extending from the inside to the outside while rotating counterclockwise. However, embodiments are not limited thereto, and the first antenna ATN1 and the second antenna ATN2 may have different shapes within the spirit and scope of the disclosure.

The first terminal ATNT1 may be electrically connected to an end of the first antenna ATN1. An end of the second antenna ATN2 may be electrically connected to another end of the first antenna ATN1. The second terminal ATNT2 may be electrically connected to another end of the second antenna ATN2. As described above, an induced current corresponding to an hourly change in magnetic flux density passing through the near-field communication antenna ATN may be induced in the near-field communication antenna ATN. The near-field communication antenna ATN may include the second antenna ATN2 in addition to the first antenna ATN1, thereby reacting to such a change in magnetic flux density more sensitively.

The first terminal ATNT1 and the first antenna ATN1 may be on a same layer. For example, the first terminal ATNT1 and the first antenna ATN1 may be disposed between the first base B1 and the second base B2. Accordingly, the first terminal ATNT1 and the first antenna ATN1 may be integrally formed as a single body. The second antenna ATN2 may be between the second base B2 and the third base B3, and an end thereof may be in contact with another end of the first antenna ATN1 through a contact hole defined in the second base B2. The second terminal ATNT2 and the first terminal ATNT1 may be on a same layer. Accordingly, another end of the second antenna ATN2 may be in contact with the second terminal ATNT2 through a contact hole defined in the second base B2.

Figure 10:
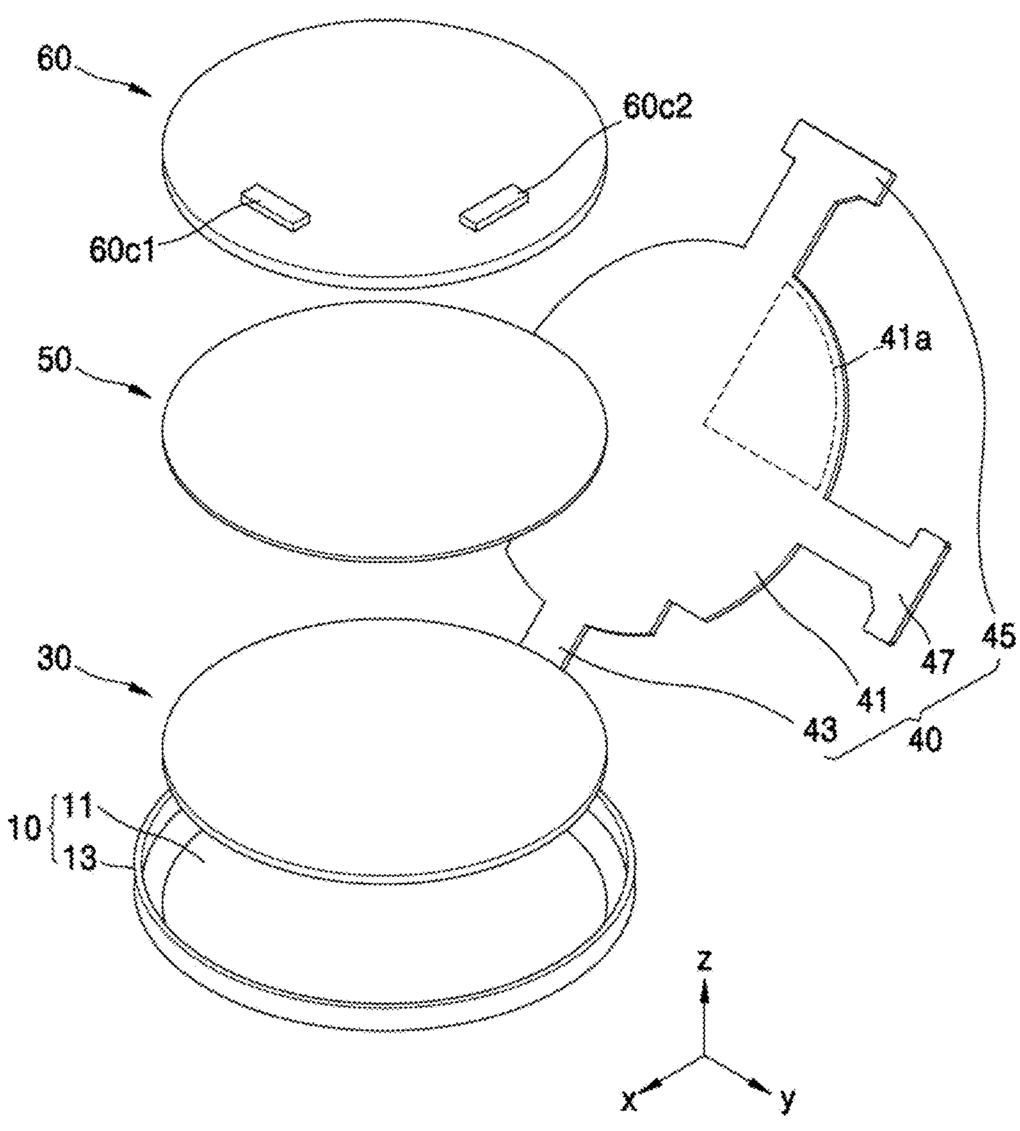
FIG. 10 is an exploded perspective view schematically showing a portion of an electronic apparatus according to an embodiment.
Figure 11:
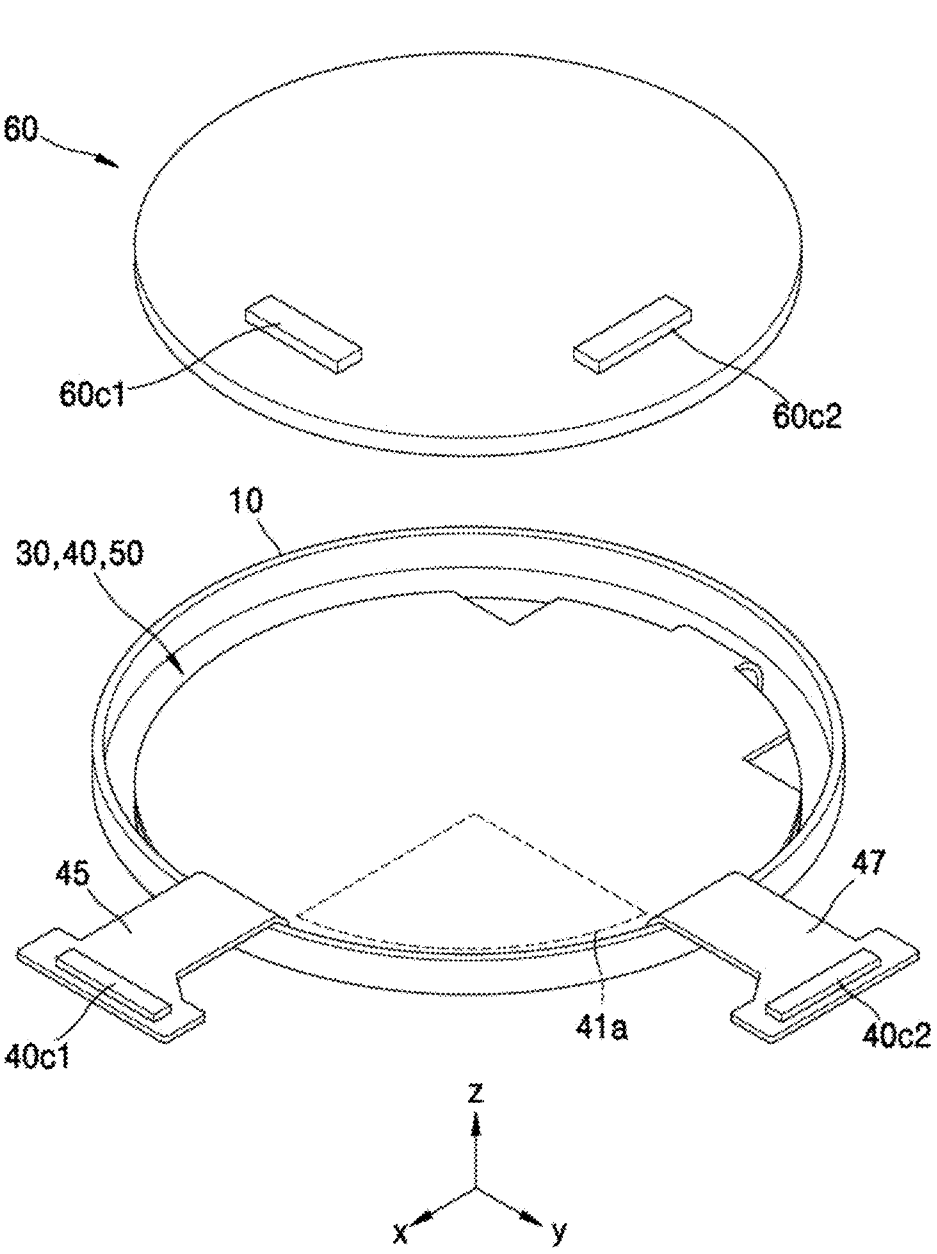
FIG. 11 is a perspective view schematically showing some elements shown in FIG. 10 being stacked on each other and some elements being bent.

It has been described thus far that an electrical signal received or generated by the near-field communication antenna ATN may be transmitted to the main circuit board 60 through the first connector 40*c*1 of the printed circuit board 40 and the first main connector 60*c*1 of the main circuit board 60. However, one or more embodiments are not limited thereto. For example, as shown in FIG. 10, which is an exploded perspective view schematically showing a portion of an electronic apparatus according to an embodiment, and FIG. 11, which is a perspective view schematically showing some elements shown in FIG. 10 being stacked on each other and some elements being bent, the printed circuit board 40 may include the first connector 40*c*1 and a second connector 40*c*2, and the main circuit board 60 may include the first main connector 60*c*1 and a second main connector 60*c*2.

For example, the printed circuit board 40 may include a second connecting portion 47 protruding from the body portion 41 in addition to the first connecting portion 45 protruding from the body portion 41, the first connector 40*c*1 may be on the first connecting portion 45, and the second connector 40*c*2 may be on the second connecting portion 47.

In this case, the first connector 40*c*1 of the printed circuit board 40 may be electrically connected to at least one of the wires of the printed circuit board 40, and the second connector 40*c*2 may be connected to wires electrically connected to the near-field communication antenna ATN. The first main connector 60*c*1 of the main circuit board 60 may be electrically connected to the first connector 40*c*1, and the second main connector 60*c*2 of the main circuit board 60 may be electrically connected to the second connector 40*c*2. Thus, an electrical signal to be applied to the display panel 30 may be transmitted to the display panel 30 through the first main connector 60*c*1 and the first connector 40*c*1, and an electrical signal from the near-field communication antenna ATN or an electrical signal to the near-field communication antenna ATN may be transmitted through the second main connector 60*c*2 and the second connector 40*c*2.

Figure 12:
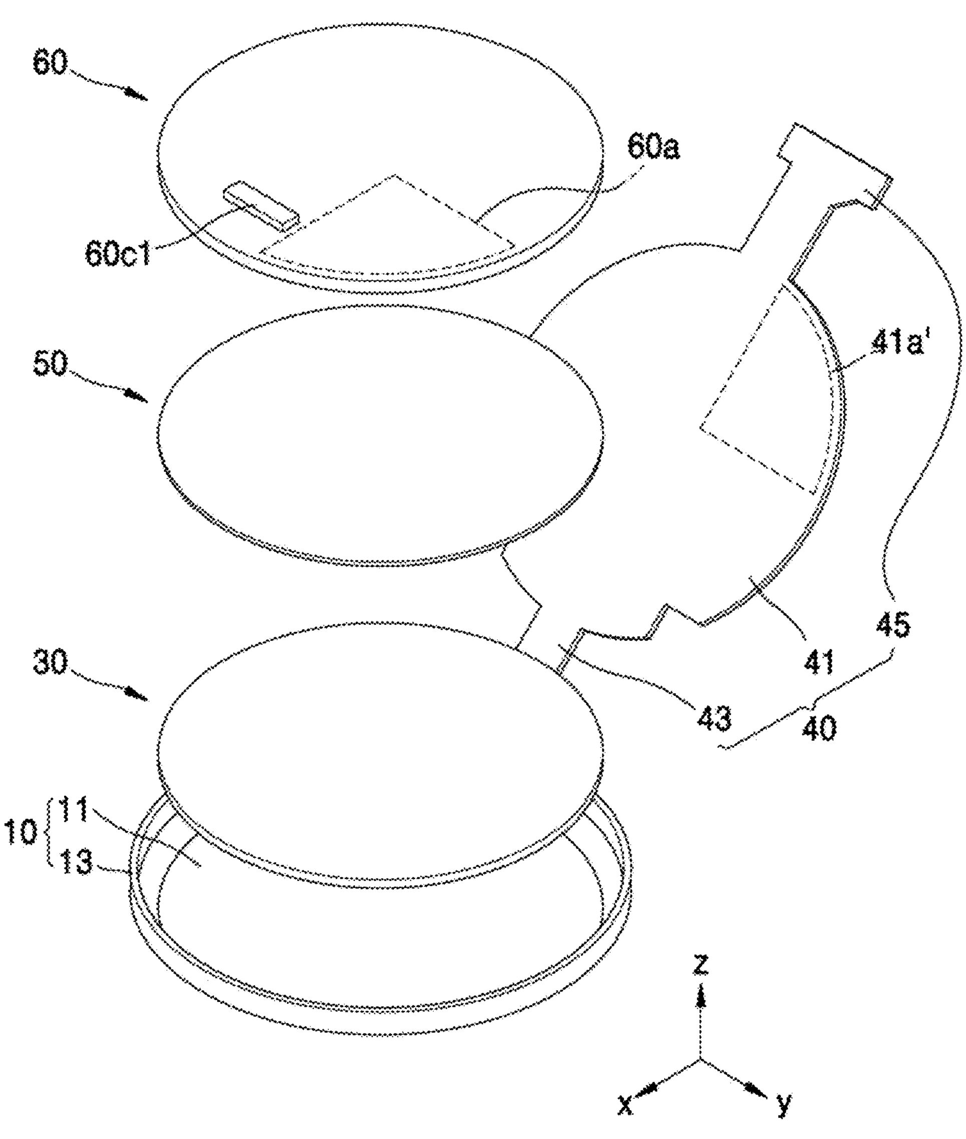
FIG. 12 is an exploded perspective view schematically showing a portion of an electronic apparatus according to an embodiment.
Figure 13:
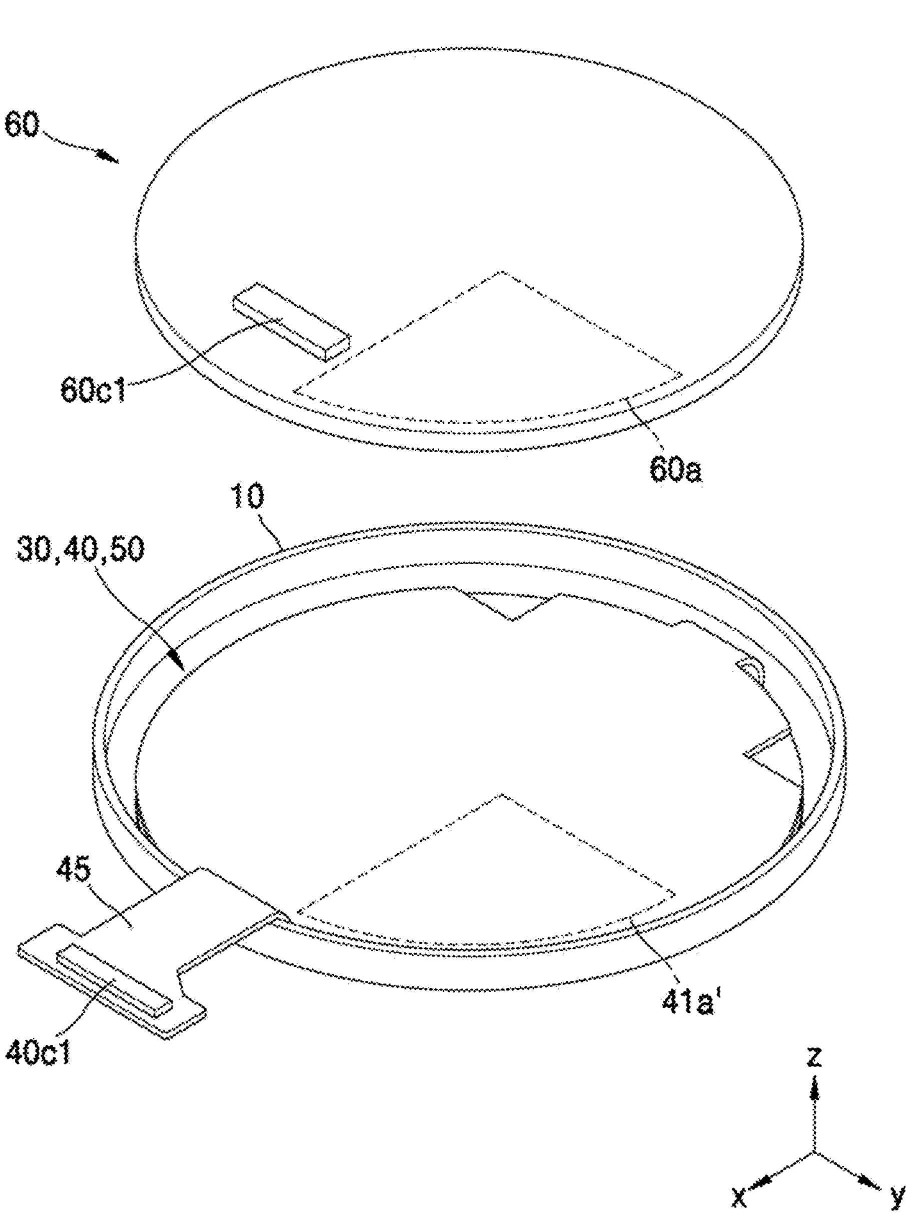
FIG. 13 is a perspective view schematically showing some elements shown in FIG. 12 which are stacked on each other or bent.

Although a case where the printed circuit board 40 includes the near-field communication antenna ATN has been described thus far, one or more embodiments are not limited thereto. For example, the main circuit board 60 may include the near-field communication antenna ATN. FIG. 12 is an exploded perspective view schematically showing a portion of an electronic apparatus according to an embodiment. FIG. 13 is a perspective view schematically showing some elements shown in FIG. 12 which are stacked on each other or bent and shows a case where the main circuit board 60 has an antenna area 60*a*. The printed circuit board 40 may have a transmissive area 41*a*' corresponding to the antenna area 60*a* of the main circuit board 60. A description of the electronic apparatus according to the previous embodiment may also apply to the electronic apparatus according to the embodiment, except for the antenna area 60*a* and the transmissive area 41*a'*.

The main circuit board 60 may have the antenna area 60*a* and a peripheral area outside the antenna area 60*a*, and the near-field communication antenna ATN may be in the antenna area 60*a*.

An induced current corresponding to an hourly change in magnetic flux density passing through the near-field communication antenna ATN may be induced in the near-field communication antenna ATN. To react to such a change in magnetic flux density sensitively, the near-field communication antenna ATN may be arranged in the form of a coil in a plane (e.g., the x-y plane) where the main circuit board 60 is disposed.

A first terminal may be electrically connected to an end of the near-field communication antenna ATN, and a second terminal may be electrically connected to another end of the near-field communication antenna ATN. Each of the first terminal and the second terminal may be, for example, a portion of a wire. The first terminal may be disposed on a layer on which the near-field communication antenna ATN may be disposed and thus the first terminal and the near-field communication antenna ATN may be integrally formed as a single body, and the second terminal may be on a layer different from the layer on which the near-field communication antenna ATN may be disposed and may be in contact with the near-field communication antenna ATN through a contact hole. For example, the main circuit board 60 may have a structure in which one or more insulating layers may be sequentially stacked on one another, and the near-field communication antenna ATN and the first terminal may be disposed between a first insulating layer and a second insulating layer, and the second terminal may be disposed between the second insulating layer and a third insulating layer and may be in contact with another end of the near-field communication antenna ATN through a contact hole defined in the second insulating layer. For example, the main circuit board 60 may have a cross-sectional shape similar to that of the printed circuit board 40 shown in FIG. 6.

In the above case of the electronic apparatus according to the embodiment, the main circuit board 60 may include the near-field communication antenna ATN, and accordingly, an electronic apparatus capable of near-field communication and having a simple structure compared to a case where the near-field communication antenna ATN is provided as a separate element distinct from the main circuit board 60 may be implemented.

As described above, wires may be arranged at the main circuit board 60 to transmit an electrical signal to be applied to the printed circuit board 40 through those wires. As described above, the near-field communication antenna ATN may be in the antenna area 60*a*. On the other hand, except wires connected to the near-field communication antenna ATN, for example, except the first terminal and the second terminal, other wires may not be in the antenna area 60*a* but in the peripheral area. For example, in the main circuit board 60, there may be no wires in the antenna area 60*a*, other than a wire or wires connected to the near-field communication antenna ATN.

Even in the electronic apparatus according to the embodiment, the cover panel 50 may be disposed between the display panel 30 and the printed circuit board 40. Even in this case, the cover panel 50 may have a structure as shown in FIG. 7. For example, the cover panel 50 may include the cushion layer 51 and the metal layer 53. In some cases, the cushion layer 51 may be attached to the display panel 30 through an adhesive. The metal layer 53 may include, for example, copper. The cover panel 50 may be disposed over a side of the display panel 30 to face away from the window 10 (i.e., may be disposed in +z direction from the display panel 30) to shield the display panel 30 from external electrical signals or electromagnetic waves.

As shown in FIG. 7, the metal layer 53 of the cover panel 50 may have the transmissive opening 53OP. As described above, in case that a wire including metal is in the antenna area 60*a*, sensitivity of the near-field communication antenna ATN may be degraded. Even in case that the metal layer 53 of the cover panel 50 overlaps the antenna area 60*a*, sensitivity of the near-field communication antenna ATN may be degraded. Accordingly, the metal layer 53 of the cover panel 50 may have the transmissive opening 53OP, and thus, the degradation of sensitivity of the near-field communication antenna ATN may be effectively prevented. Particularly; when viewed in the direction (the z-axis direction) perpendicular to the display panel 30, the transmissive opening 53OP in the metal layer 53 may overlap the antenna area 60*a* of the main circuit board 60, and thus, high sensitivity of the near-field communication antenna ATN may be maintained. In this regard, when viewed in the direction (the z-axis direction) perpendicular to the display panel 30, an area of the transmissive opening 53OP of the metal layer 53 may be substantially equal to or greater than that of the antenna area 60*a* of the main circuit board 60, and thus, high sensitivity of the near-field communication antenna ATN may be reliably maintained.

Similarly, when viewed in the direction (the z-axis direction) perpendicular to the display panel 30, wires included in the printed circuit board 40 may overlap the peripheral area outside the antenna area 60*a* of the main circuit board 60. For example, there may be no wires of the printed circuit board 40 in the transmissive area 41*a*' of the printed circuit board 40, and when viewed in the direction (the z-axis direction) perpendicular to the display panel 30, the transmissive area 41*a*' of the printed circuit board 40 may overlap the antenna area 60*a* of the main circuit board 60, thereby maintaining high sensitivity of the near-field communication antenna ATN. In this regard, when viewed in the direction (the z-axis direction) perpendicular to the display panel 30, an area of the transmissive area 41*a*' of the printed circuit board 40 may be substantially equal to or greater than that of the antenna area 60*a* of the main circuit board 60, and thus, high sensitivity of the near-field communication antenna ATN may be reliably maintained.

Even in case that the main circuit board 60 includes the near-field communication antenna ATN, the near-field communication antenna ATN may have the structure shown in FIGS. 8 and 9. For example, a description of the structure of the near-field communication antenna ATN including the first antenna ATN1 and the second antenna ATN2, described above with reference to FIGS. 8 and 9, may also apply to a case where not the printed circuit board 40 but the main circuit board 60 includes the near-field communication antenna ATN.

For example, the first antenna ATN1 may have a shape like a wire extending from the outside to the inside while rotating clockwise, and the second antenna ATN2 may have a shape like a wire extending from the inside to the outside while rotating counterclockwise. The first terminal ATNT1 may be electrically connected to an end of the first antenna ATN1, an end of the second antenna ATN2 may be electrically connected to another end of the first antenna ATN1, and the second terminal ATNT2 may be electrically connected to another end of the second antenna ATN2. The first terminal ATNT1 and the first antenna ATN1 may be on a same layer, and the first terminal ATNT1 and the first antenna ATN1 may be integrally formed as a single body. The second antenna ATN2 may be disposed on a layer different from the layer on which the first antenna ATN1 may be disposed, and an end thereof may be in contact with another end of the first antenna ATN1 through a contact hole. The second terminal ATNT2 and the first terminal ATNT1 may be on a same layer. Accordingly, another end of the second antenna ATN2 may be in contact with the second terminal ATNT2 through a contact hole.

For reference, in case that the main circuit board 60 includes the near-field communication antenna ATN as described above, an electrical signal from the near-field communication antenna ATN or an electrical signal to the near-field communication antenna ATN may be transmitted to or from a central processing unit, etc., mounted on the main circuit board 60 through wires of the main circuit board 60.

According to one or more of the above embodiments, an electronic apparatus having a simple structure and capable of near-field communication may be implemented. However, one or more embodiments are not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic apparatus comprising:
a light-transmitting window;
a display panel disposed over the light-transmitting window;
a printed circuit board electrically connected to the display panel, disposed over a side of the display panel to face away from the light-transmitting window, and comprising wires and a near-field communication antenna;
a main circuit board electrically connected to the printed circuit board and disposed over a side of the printed circuit board to face away from the display panel; and
a cover panel between the display panel and the printed circuit board, wherein the cover panel comprises a cushion layer and a metal layer, and the metal layer comprises a transmissive opening.

2. The electronic apparatus of claim 1, wherein
the printed circuit board comprises an antenna area and a peripheral area outside the antenna area, and
the near-field communication antenna is disposed in the antenna area.

3. The electronic apparatus of claim 2, wherein, in the printed circuit board, the wires are not disposed in the antenna area except for one or more of the wires electrically connected to the near-field communication antenna.

4. The electronic apparatus of claim 2, wherein, among the wires in the printed circuit board, wires other than one or more of the wires electrically connected to the near-field communication antenna are in the peripheral area.

5. The electronic apparatus of claim 1, wherein, when viewed in a direction perpendicular to the display panel, the transmissive opening overlaps an antenna area.

6. The electronic apparatus of claim 5, wherein, when viewed in the direction perpendicular to the display panel, an area of the transmissive opening is substantially equal to or greater than an area of the antenna area.

7. The electronic apparatus of claim 1, wherein
the printed circuit board comprises a first connector electrically connected to at least one of the wires and the near-field communication antenna, and
the main circuit board comprises a first main connector electrically connected to the first connector.

8. The electronic apparatus of claim 1, wherein
the printed circuit board comprises:
a first connector electrically connected to at least one of the wires; and
a second connector electrically connected to the near-field communication antenna, and
the main circuit board comprises:
a first main connector electrically connected to the first connector; and
a second main connector electrically connected to the second connector.

9. An electronic apparatus comprising:
a light-transmitting window;
a display panel disposed over the light-transmitting window;
a printed circuit board electrically connected to the display panel, disposed over a side of the display panel to face away from the light-transmitting window, and comprising wires and a near-field communication antenna;
a main circuit board electrically connected to the printed circuit board and disposed over a side of the printed circuit board to face away from the display panel;
a first terminal electrically connected to an end of the near-field communication antenna, the first terminal and the near-field communication antenna being disposed on a same layer; and
a second terminal electrically connected to another end of the near-field communication antenna, the second terminal and the near-field communication antenna being disposed on different layers.

10. The electronic apparatus of claim 9, wherein the first terminal and the near-field communication antenna are integral with each other.

11. An electronic apparatus comprising:
a light-transmitting window;
a display panel disposed over the light-transmitting window;
a printed circuit board electrically connected to the display panel, disposed over a side of the display panel to face away from the light-transmitting window, and comprising wires and a near-field communication antenna;

a main circuit board electrically connected to the printed circuit board and disposed over a side of the printed circuit board to face away from the display panel;

a first terminal disposed on a layer electrically connected to an end of the near-field communication antenna, the first terminal and the near-field communication antenna being disposed on a same layer;

an additional antenna having an end electrically connected to another end of the near-field communication antenna, the additional antenna and the near-field communication antenna being disposed on different layers; and a second terminal electrically connected to another end of the additional antenna.

12. The electronic apparatus of claim 11, wherein the first terminal and the near-field communication antenna are integral with each other.

13. The electronic apparatus of claim 11, wherein the second terminal and the first terminal are disposed on a same layer.

14. An electronic apparatus comprising:

a light-transmitting window;

a display panel disposed over the light-transmitting window;

a printed circuit board electrically connected to the display panel, disposed over a side of the display panel to face away from the light-transmitting window, and comprising wires that transmit an electrical signal to be applied to the display panel; and a main circuit board electrically connected to the printed circuit board, disposed over a side of the printed circuit board to face away from the display panel, and comprising wires and a near-field communication antenna, wherein at least one of an application processor or a central processing unit is disposed on the main circuit board.

15. The electronic apparatus of claim 14, wherein the main circuit board comprises an antenna area and a peripheral area outside the antenna area, and the near-field communication antenna is disposed in the antenna area.

16. The electronic apparatus of claim 15, wherein, in the main circuit board, the wires are not disposed in the antenna area except for one or more of the wires electrically connected to the near-field communication antenna.

17. The electronic apparatus of claim 15, wherein, among the wires in the main circuit board, wires other than one or more of the wires electrically connected to the near-field communication antenna are in the peripheral area.

18. The electronic apparatus of claim 15, further comprising:

a cover panel between the display panel and the printed circuit board and comprising a cushion layer and a metal layer, wherein the metal layer comprises a transmissive opening.

19. The electronic apparatus of claim 18, wherein, when viewed in a direction perpendicular to the display panel, the transmissive opening overlaps the antenna area, and the wires in the printed circuit board overlap the peripheral area.

20. The electronic apparatus of claim 19, wherein, when viewed in the direction perpendicular to the display panel, an area of the transmissive opening is substantially equal to or greater than an area of the antenna area.

* * * * *